(12) United States Patent
Lee et al.

(10) Patent No.: US 9,893,020 B2
(45) Date of Patent: Feb. 13, 2018

(54) SEMICONDUCTOR DEVICE

(71) Applicant: Samsung Electronics Co., Ltd., Suwon-si, Gyeonggi-do (KR)

(72) Inventors: Baik-Woo Lee, Gwangmyeong-si (KR); Eun-Seok Song, Hwaseong-si (KR); Young-Jae Kim, Hwaseong-si (KR); Jae-Gwon Jang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/227,953

(22) Filed: Aug. 3, 2016

(65) Prior Publication Data
US 2017/0069828 A1      Mar. 9, 2017

(30) Foreign Application Priority Data

Sep. 9, 2015  (KR) .................. 10-2015-0127412

(51) Int. Cl.
*H01L 43/02*      (2006.01)
*H01L 23/552*     (2006.01)

(52) U.S. Cl.
CPC .. *H01L 23/552* (2013.01); *H01L 2224/48091* (2013.01); *H01L 2224/48228* (2013.01); *H01L 2224/73265* (2013.01)

(58) Field of Classification Search
CPC ..................................... H01L 43/02
See application file for complete search history.

(56) References Cited

U.S. PATENT DOCUMENTS 5,763,824 A *  6/1998  King ............... H01L 23/552
                                              174/374
6,124,636 A *  9/2000  Kusamitsu .......... H01L 23/66
                                              257/532

(Continued)

FOREIGN PATENT DOCUMENTS

EP       1739748 A2    1/2007
JP       201553450 A   3/2015
(Continued)

*Primary Examiner* — Thao P Le
(74) *Attorney, Agent, or Firm* — Renaissance IP Law Group LLP

(57) ABSTRACT

In one embodiment, a semiconductor device comprising, a substrate comprising a wiring layer, a first conductive shielding layer disposed on the substrate and electrically isolated from the wiring layer, the first conductive shielding layer comprising a first bonding surface and a first end surface extending from the first bonding surface, a semiconductor chip disposed on the first conductive shielding layer, a molding member disposed over the first conductive shielding layer to cover the semiconductor chip, a second conductive shielding layer disposed over the first conductive shielding layer and the molding member, the second conductive shielding layer comprising a second bonding surface and a second end surface extending from the second bonding surface, and a bonding portion disposed between the first and second bonding surfaces, the bonding portion comprising a top surface and a bottom surface opposite to the top surface. The bottom surface of the bonding portion contacts the first bonding surface to form a first contact surface. The top surface of the bonding portion contacts the second bonding surface to form a second contact surface. An area of the second contact surface is larger than an area of the second end surface.

10 Claims, 17 Drawing Sheets

(56) References Cited

U.S. PATENT DOCUMENTS

| | | | |
|---|---|---|---|
| 6,833,180 B1* | 12/2004 | Kodemura | C09J 9/02 |
| | | | 156/306.6 |
| 6,882,041 B1* | 4/2005 | Cheah | H01L 21/54 |
| | | | 257/667 |
| 6,933,602 B1* | 8/2005 | Patel | H01L 23/3128 |
| | | | 257/675 |
| 6,940,153 B2 | 9/2005 | Spencer et al. | |
| 6,962,833 B2 | 11/2005 | Tuttle et al. | |
| 7,312,525 B2* | 12/2007 | Tatt | H01L 23/3677 |
| | | | 257/704 |
| 8,552,539 B1 | 10/2013 | Foster | |
| 8,749,033 B2 | 6/2014 | Watanabe et al. | |
| 9,190,361 B2 | 11/2015 | Noma | |
| 2005/0110162 A1* | 5/2005 | Meyer-Berg | H01L 21/4853 |
| | | | 257/778 |
| 2006/0289970 A1 | 12/2006 | Gogl et al. | |
| 2009/0079863 A1* | 3/2009 | Aoki | G02B 13/001 |
| | | | 348/374 |
| 2010/0110656 A1* | 5/2010 | Ko | H01L 21/561 |
| | | | 361/818 |
| 2014/0048913 A1* | 2/2014 | Park | H01L 23/552 |
| | | | 257/659 |
| 2014/0312473 A1 | 10/2014 | Chung et al. | |
| 2015/0084141 A1 | 3/2015 | Fujimori | |
| 2015/0344296 A1* | 12/2015 | Pahl | B81B 7/0054 |
| | | | 257/416 |

FOREIGN PATENT DOCUMENTS

| | | |
|---|---|---|
| JP | 2015065223 A | 4/2015 |
| KR | 20070001015 A | 1/2007 |

* cited by examiner

SEMICONDUCTOR DEVICE

This application claims priority from Korean Patent Application No. 10-2015-0127412 filed on Sep. 9, 2015 with the Korean Intellectual Property Office, the disclosure of which is incorporated herein by reference in its entirety.

BACKGROUND

1. Technical Field

The subject matter disclosed herein relates to a semiconductor device.

2. Description of the Related Art

A magnetic random-access memory (MRAM) device is a non-volatile random-access memory device capable of writing/reading data at high speed. Because of such characteristics, MRAM devices are expected to be one of the most promising new technologies.

Typically, data is stored in each unit cell of a MRAM. A magnetic tunnel junction (MTJ) pattern is commonly employed. The MTJ pattern includes two ferromagnetic films and a tunnel insulation film disposed therebetween. Specifically, the MTJ pattern includes a pinned ferromagnetic film having a fixed magnetization direction, a free ferromagnetic film having a magnetization direction that can be changed between parallel and anti-parallel directions with respect to the pinned ferromagnetic film, and a tunnel insulation film disposed between the pinned ferromagnetic film and the free ferromagnetic film.

SUMMARY

Exemplary embodiments of the present disclosure provide a semiconductor device with improved reliability of a semiconductor chip therein by way of increasing the effect of shielding magnitude field.

According to an exemplary embodiment of the present disclosure, a semiconductor device comprising, a substrate comprising a wiring layer, a first conductive shielding layer disposed on the substrate and electrically insulated from the wiring layer, the first conductive shielding layer comprising a first bonding surface and a first end surface extending from the first bonding surface, a semiconductor chip disposed on the first conductive shielding layer, a molding member disposed over the first conductive shielding layer to cover the semiconductor chip, a second conductive shielding layer disposed over the first conductive shielding layer and the molding member, the second conductive shielding layer comprising a second bonding surface and a second end surface extending from the second bonding surface, and a bonding portion disposed between the first and second bonding surfaces, the bonding portion comprising a top surface and a bottom surface opposite to the top surface. The bottom surface of the bonding portion contacts the first bonding surface to form a first contact surface. The top surface of the bonding portion contacts the second bonding surface to form a second contact surface. An area of the second contact surface is larger than an area of the second end surface.

According to an exemplary embodiment of the present disclosure, A semiconductor device comprising, a substrate comprising a wiring layer, a first conductive shielding layer disposed on the substrate, the first conductive shielding layer being electrically insulated from the wiring layer, a semiconductor chip disposed on the first conductive shielding layer, a second conductive shielding layer disposed over the first conductive shielding layer and the semiconductor chip, and a bonding portion disposed between and coming in contact with the first and second conductive shielding layers, the bonding portion extended in a first direction substantially parallel with the first and second conductive shielding layers.

In some embodiments, a length of the bonding portion in the first direction is larger than a thickness of the second conductive shielding layer.

In some embodiments, a semiconductor device comprises a substrate; a first conductive shielding layer disposed on the substrate; a semiconductor chip disposed on the first conductive shielding layer; a second conductive shielding layer disposed over the first conductive shielding layer and the semiconductor chip; a side portion of the first or second conductive shielding layer extending along a side surface of the semiconductor chip; an extension portion of the first or second conductive shielding layer extending from the side portion of the first or second conductive shielding layer toward or away from the semiconductor chip; and a bonding portion disposed between and contacting the first and second conductive shielding layers.

In some embodiments, a thickness of the bonding portion is smaller than a thickness of the semiconductor chip.

In some embodiments, the semiconductor chip is connected to the substrate through a through electrode.

However, exemplary embodiments of the present disclosure are not restricted to the one set forth herein. The above and other Exemplary embodiments of the present disclosure will become more apparent to one of ordinary skill in the art to which the present disclosure pertains by referencing the detailed description of the exemplary embodiments of the present disclosure given below.

Other features and aspects will be apparent from the following detailed description, the drawings, and the claims.

DETAILED DESCRIPTION OF THE EMBODIMENTS

Figure 1:
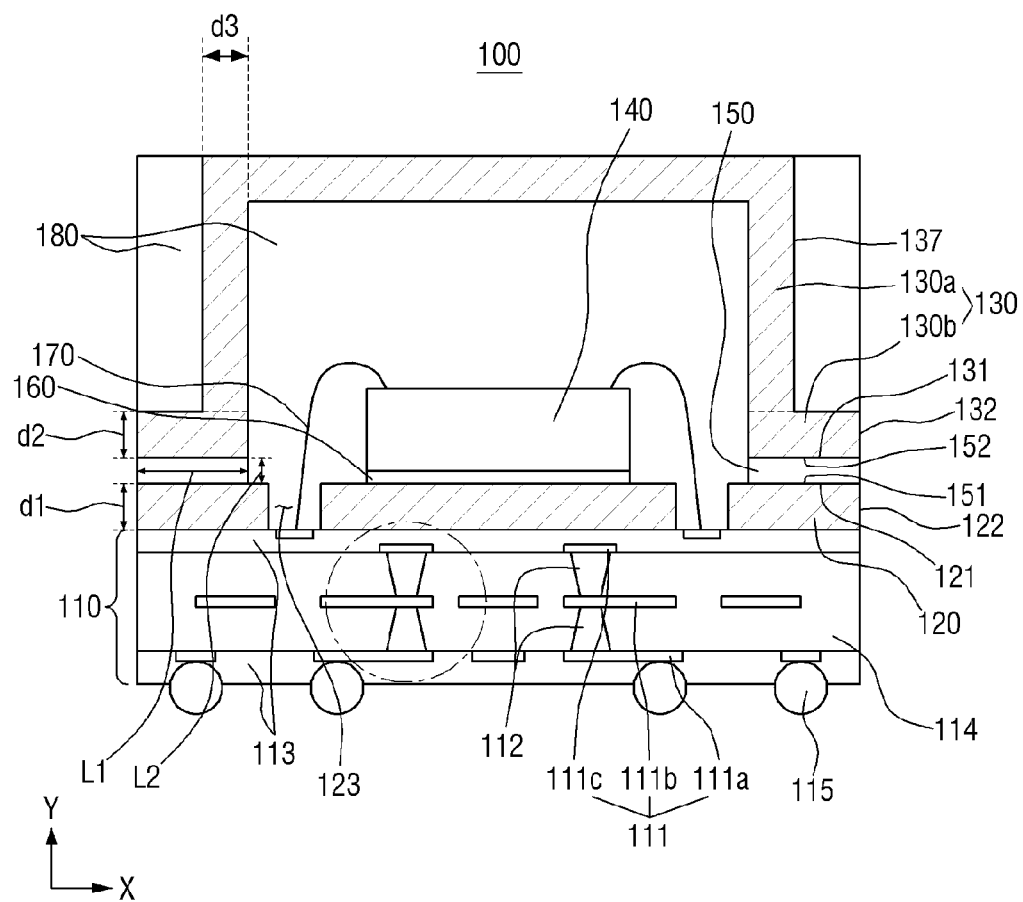
FIG. 1 is a cross-sectional view of a semiconductor device according to an exemplary embodiment of the present disclosure.

Exemplary embodiments of the present disclosure will be described more fully hereinafter with reference to the accompanying drawings. In the drawings, the size and relative sizes of layers and regions may be exaggerated for clarity. Like reference numerals may refer to like elements throughout the accompanying drawings.

It will be understood that when an element or layer is referred to as being "on," "connected to", or "covered by" another element or layer, it can be directly on, connected to, or covered by the other element or layer or intervening elements or layers may be present. In addition, it will also be understood that when an element or layer is referred to as being "between" two elements or layers, it can be the only element or layer between the two elements or layers, or one or more intervening elements or layers may also be present. As used herein, the term "and/or" includes any and all combinations of one or more of the associated listed items. Further, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

The present disclosure will be described with reference to perspective views, cross-sectional views, and/or plan views, in which exemplary embodiments of the disclosure are shown. Thus, the profile of an exemplary view may be modified according to manufacturing techniques and/or allowances. That is, the exemplary embodiments of the disclosure are not intended to limit the scope of the present disclosure but cover all changes and modifications that can be caused due to a change in manufacturing process. Thus, regions shown in the drawings are illustrated in schematic form and the shapes of the regions are presented simply by way of illustration and not as a limitation.

Hereinafter, a semiconductor device according to an exemplary embodiment of the present disclosure will be described with reference to FIGS. 1 and 2.

FIG. 1 is a cross-sectional view of a semiconductor device according to an exemplary embodiment of the present disclosure. FIG. 2 is a partial enlarged view showing the structure inside the substrate of FIG. 1.

Referring to FIG. 1, a semiconductor device 100 may include a substrate 110, a first conductive shielding layer 120, a second conductive shielding layer 130, a semiconductor chip 140, a bonding portion 150, an adhesion layer 160, a bonding wire 170 and a molding member 180.

The substrate 110 may include conductive wiring layers (or line layers) 111, through vias 112, solder mask layers 113, insulation layers 114 and external connection terminals 115. The wiring layers 111 may include a lower wiring layer 111*a*, an intermediate wiring layer 111*b*, and a lower wiring layer 111*c*.

The wiring layers 111 may be disposed inside the substrate 110. Each of the wiring layers 111 may be spaced apart from one another. Voltages of different levels may be applied to the wiring layers 111.

The solder mask layers 113 may be disposed on the upper and lower wiring layers, 111*a*, 111*c*, respectively. The solder mask layers 113 may protect the top surfaces of the upper and lower wiring layers 111*a*, 111*c*.

Each of the insulation layers 114 may be interposed between two corresponding wiring layers 111. The insulation layers 114 may electrically insulate the wiring layers 111 from one another.

The through vias 112 may penetrate the insulation layers 114. The through vias 112 may electrically connect the wiring layers 111 to one another.

The external connection terminals 115 may be disposed under the substrate 110 and may be electrically connected to the lower wiring layer 111*c*. Although solder balls are shown as the external connection terminals 115 in FIG. 1, the present disclosure is not limited thereto. For example, the external connection terminals 115 may be formed of a suitable conductive material having any one or more of various shapes.

In some embodiments, the substrate 110 may be a suitable package substrate for semiconductor packaging, for example, a printed circuit board (PCB).

The first conductive shielding layer 120 may be disposed on the substrate 110. Specifically, the first conductive shielding layer 120 may be substantially parallel with the substrate 110.

The first conductive shielding layer 120 may include a conductive material. For example, the first conductive shielding layer 120 may include at least one of iron (Fe), an alloy of iron and cobalt (Fe—Co alloy), an alloy of nickel and iron (Ni—Fe alloy), moly-permalloy, supermalloy, Metglas™ or Mu-shield™. However, the present disclosure is not limited to the above-listed materials.

The first conductive shielding layer 120 may be affected by a magnetic field to generate a magnetic flux. Specifically, the first conductive shielding layer 120 may be affected by an external magnetic field to generate a magnetic flux therein.

Figure 2:
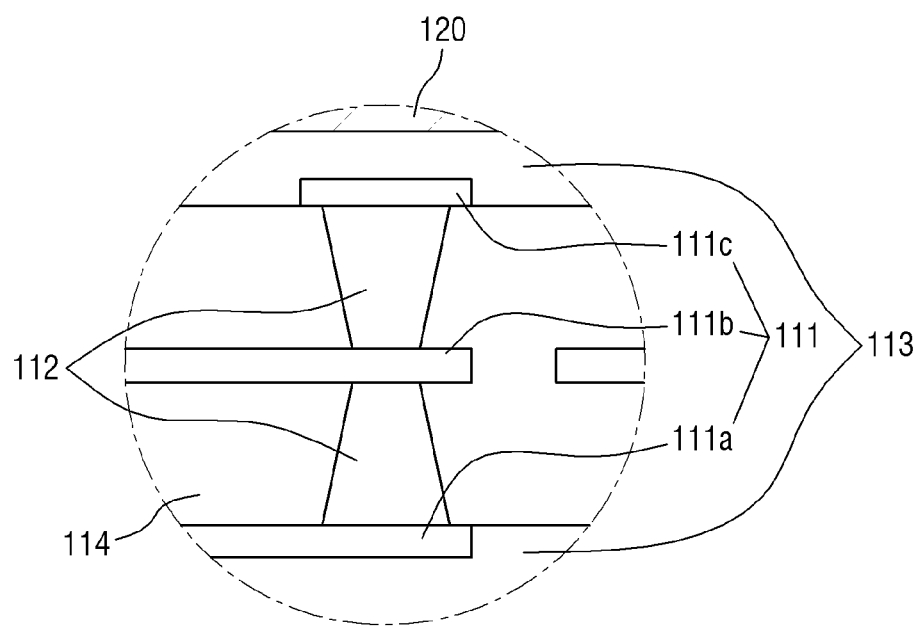
FIG. 2 is a partial enlarged view showing the structure inside the substrate of FIG. 1.

Referring to FIG. 2, the first conductive shielding layer 120 may be spaced apart from the wiring layers 111. As a result, the first conductive shielding layer 120 may be electrically insulated from the wiring layers 111.

Referring back to FIG. 1, the first conductive shielding layer 120 may include a first bonding surface 121, a first end surface 122 and openings 123.

The first bonding surface 121 refers to the top surface of the first conductive shielding layer 120 that contacts the bottom surface of the bonding portion 150. The first bonding surface 121 may comprise a portion of the top surface of the first conductive shielding layer 120.

The first end surface 122 refers to an end portion of the first conductive shielding layer 120 at an outside edge of the first bonding surface 121. A cross-sectional area of the first conductive shielding layer 120 may be generally equal throughout the first conductive shielding layer 120. That is, the cross-sectional area of the first conductive shielding layer 120 may be generally equal to an area of the first end surface 122. However, the present disclosure is not limited thereto. That is, in some embodiments, the cross-sectional area of the first conductive shielding layer 120 may differ from the area of the first end surface 122.

The openings 123 may penetrate the first conductive shielding layer 120 at various desired locations. Although two openings 123 are shown penetrating the first conductive shielding layer 120 on opposite sides of the semiconductor chip 140 in FIG. 1, the present disclosure is not limited thereto. In some embodiments, only one opening may be formed through the first conductive shielding layer 120. For example, an opening may be formed on only one side of the first conductive shielding layer 120. In other embodiments, openings may be formed under the adhesion layer 160.

The adhesion layer 160 may be disposed on the first conductive shielding layer 120. Specifically, the adhesion layer 160 may be disposed in the center portion of the first conductive shielding layer 120 such that it is substantially parallel with an upper surface of the first conductive shielding layer 120. The adhesion layer 160 may not be disposed in the portions where the openings 123 are formed in the first conductive shielding layer 120. In some embodiments, the adhesion layer 160 may be disposed on only one side of the first conductive shielding layer 120.

The adhesion layer 160 may include an organic resin material such as an epoxy resin, an acrylic resin, a polyester resin and a polycarbonate. The adhesion layer 160 may connect the first conductive shielding layer 120 to the semiconductor chip 140.

The semiconductor chip 140 may be disposed on the adhesion layer 160. The semiconductor chip 140 may be fixed on the first conductive shielding layer 120 using the adhesion layer 160.

The semiconductor chip 140 may be fabricated by, but is not limited to, using silicon-on-insulator (SOI), silicon-germanium and so on.

The semiconductor chip 140 may be a non-volatile memory chip, for example. Specifically, the memory chip may be a flash memory chip. More specifically, the memory chip may be either a NAND flash memory chip or a NOR flash memory chip. However, the present disclosure is not limited to the above-mentioned memory chips. In some embodiments, the memory chip may include one of a phase-change random-access memory (PRAM), a magneto-resistive random-access memory (MRAM) and a resistive random-access memory (RRAM).

An STT-MRAM makes use of the phenomenon that when a spin-polarized electric current having a high density passes through a magnetic substance, the magnetization orientation of the magnetic substance tends to be aligned with the spin polarization of the electric current if the magnetization orientation of the magnetic substance is not coincident with the spin polarization of the electric current.

If the semiconductor chip 140 is a non-volatile memory chip, it may be implemented as a variety of types of semiconductor packages. For example, the semiconductor chip 140 according to the present disclosure may be packaged using any one of: the package-on-package (PoP) technique, the ball grid arrays (BGAs) technique, the chip scale packages (CSPs) technique, the plastic leaded chip carrier (PLCC) technique, the plastic dual in-line package (PDIP) technique, the die-in-waffle pack technique, the die-in-wafer form technique, the chip on board (COB) technique, the ceramic dual in-line package (CERDIP) technique, the plastic metric quad flat pack (MQFP) technique, thin quad flatpack (TQFP) technique, the small outline (SOIC) technique, the shrink small outline package (SSOP) technique, the thin small outline package (TSOP) technique, the system in package (SIP) technique, the multi chip package (MCP) technique, the wafer-level fabricated package (WFP) technique, the wafer-level processed stack package (WSP) technique, and so on.

If the semiconductor chip 140 is a MRAM, data is stored in a magnetic tunnel junction (MJT). A data value of either "0" or "1" may be stored in the MTJ by varying a magnetic field applied thereto.

Since data is stored in the MRAM based on a change in a magnetic field, an error may occur if external magnetic field exceeds a tolerance level of the MRAM circuit. In this regard, the semiconductor device 100 according to the present disclosure can reduce or prevent such an error caused by external magnetic field.

The semiconductor chip 140 may be connected to the substrate 110 through the bonding wire 170. Specifically, the bonding wire 170 may electrically connect the semiconductor chip 140 to the wiring layers 111 in the substrate 110 via the openings 123 penetrating the first conductive shielding layer 120.

The molding member 180 may be disposed over the substrate 110 such that it covers the semiconductor chip 140. Specifically, the molding member 180 may cover the semiconductor chip 140, a part of the substrate 110 exposed via the openings 123, and a portion of the first conductive shielding layer 120.

The molding member 180 may protect the semiconductor chip 140, the bonding wire 170 and the first conductive shielding layer 120 disposed on the substrate 110. In addition, the molding member 180 may surround the side surfaces of the second conductive shielding layer 130 to protect the second conductive shielding layer 130. However, the present disclosure is not limited thereto. In some embodiments, the molding member 180 may not be disposed on the side surfaces of the second conductive shielding layer 130. In other embodiments, the molding member 180 may cover the top surface of the second conductive shielding layer 130.

The molding member 180 may be made of, but is not limited to, an epoxy molding compound (EMC) or an underfill material.

The second conductive shielding layer 130 may be disposed on the bonding portion 150 and the molding member 180. Specifically, the second conductive shielding layer 130 may be disposed to cover the bonding portion 150 disposed on the first conductive shielding layer 120 and the molding member 180. More specifically, a side portion 130*a* of the second conductive shielding layer 130 may extend along a side surface 137 of the molding member 180. The molding member 180 may therefore be substantially surrounded by the first and second conductive shielding layers 120, 130. An extension portion 130b may be arranged at a bottom of the side portion 130a to cover the bonding portion 150.

The second conductive shielding layer 130 may include a conductive material. For example, the second conductive shielding layer 130 may include at least one of iron (Fe), an alloy of iron and cobalt (Fe—Co alloy), an alloy of nickel and iron (Ni—Fe alloy), moly-permalloy, supermalloy, Metglas™ or Mu-shield™. However, the present disclosure is not limited to the above-listed materials.

The second conductive shielding layer 130 may be affected by a magnetic field to generate a magnetic flux. Specifically, the second conductive shielding layer 130 may be affected by the magnetic flux generated in the first conductive shielding layer 120 to generate a magnetic flux therein.

The second conductive shielding layer 130 may include a second bonding surface 131 and a second end surface 132.

The second bonding surface 131 refers to a bottom surface of the extension portion 130b of the second conductive shielding layer 130 that contacts a top surface 152 of the bonding portion 150.

The length of the second bonding surface 131 in a first direction (i.e., an x-direction) may be equal to the length of the first bonding surface 121 in the first direction. However, the present disclosure is not limited thereto. That is, in some embodiments, the length of the second bonding surface 131 in the first direction may differ from the length of the first bonding surface 121 in the first direction. Specifically, the area of the second bonding surface 131 may differ from the area of the first bonding surface 121.

The second end surface 132 refers to a surface of the second conductive shielding layer 130 located at an outside edge of the extension portion 130b. The cross-sectional area of the second conductive shielding layer 130 may be generally equal throughout the second conductive shielding layer 130. That is, the area of the cross section of the second conductive shielding layer 130 may be generally equal to the area of the second end surface 132. However, the present disclosure is not limited thereto. That is, in some embodiments, the cross-sectional area of the second conductive shielding layer 130 may differ from the area of the second end surface 132.

The bonding portion 150 may be disposed between the first conductive shielding layer 120 and the second conductive shielding layer 130. Specifically, the bonding portion 150 may be disposed between the first bonding surface 121 of the first conductive shielding layer 120 and the second bonding surface 131 of the second conductive shielding layer 130. More specifically, the top surface of the bonding portion 150 may contact the second bonding surface 131. The bottom surface of the bonding portion 150 may contact the first bonding surface 121.

The bonding portion 150, the first conductive shielding layer 120 and the second conductive shielding layer 130 may collectively define a sealed space above the substrate 110. The semiconductor chip 140 may be disposed in the sealed space, so that it can be protected from external magnetic field. The sealed space may be filled with the molding member 180.

The bonding portion 150 may be substantially parallel with the first conductive shielding layer 120 and may be disposed along the periphery of the first conductive shielding layer 120 to surround the semiconductor chip 140 in plan view (not illustrated). However, the present disclosure is not limited thereto. In some embodiments, the bonding portion 150 may be disposed intermittently along the periphery of the first conductive shielding layer 120 or along only a selected portion of the periphery of the first conductive shielding layer 120 (i.e., along only one side or edge of the semiconductor chip 140).

The bonding portion 150 may include a first contact surface 151 and a second contact surface 152. The first contact surface 151 refers to the bottom surface of the bonding portion 150 that contacts the first bonding surface 121 of the first conductive shielding layer 120. The first contact surface 151 may be formed on the bottom surface of the bonding portion 150. The second contact surface 152 refers to the top surface of the bonding portion 152 that contacts the second bonding surface 131 of the second conductive shielding layer 130. The second contact surface 152 may be formed on the top surface of the bonding portion 150.

The area of the first contact surface 151 may be equal to the area of the first bonding surface 121. In addition, the area of the second contact surface 152 may be equal to the area of the second bonding surface 131. However, the present disclosure is not limited thereto. In some embodiments, the area of the first contact surface 151 may differ from the area of the first bonding surface 121, and the area of the second contact surface 152 may differ from the area of the second bonding surface 131.

The bonding portion 150 may include one or more organic resins chosen from an epoxy resin, an acrylic resin, a polyester resin and a polycarbonate.

The bonding portion 150 may include an organic resin to bond the first conductive shielding layer 120 with the second conductive shielding layer 130. In addition, the organic resin may transfer a magnetic flux generated in the second conductive shielding layer 130 to the first conductive shielding layer 120.

The bonding portion 150 may include, for example, a filler containing nickel (Ni). As the bonding portion 150 includes an organic resin together with a filler, it can increase the amount of the transferred magnetic flux, which is generated in the second conductive shielding layer 130.

The length L1 of the bonding portion 150 in the first direction may be larger than the length L2 of the bonding portion 150 in a second direction (i.e., a y-direction). If the length L1 of the bonding portion 150 in the first direction increases, the areas of the first contact surface 151 and the second contact surface 152 also increase. As a result, the magnetic flux generated in the second conductive shielding layer 130 can be transferred to the first conductive shielding layer 120 more efficiently.

If the length L2 of the bonding portion 150 in the second direction decreases, the distance between the first contact surface 151 and the second contact surface 152 is reduced. As a result, the magnetic flux generated in the second conductive shielding layer 130 can be transferred to the first conductive shielding layer 120 more efficiently.

Accordingly, the magnetic flux generated in the second conductive shielding layer 130 can be transferred to the first conductive shielding layer 120 more efficiently as the length L1 of the bonding portion 150 in the first direction increases and the length L2 of the second direction decreases.

The length L1 of the bonding portion 150 in the first direction may be larger than a thickness d1 of the first conductive shielding layer 120 and/or a thickness d3 of the second conductive shielding layer 130. Accordingly, the contact areas between the first conductive shielding layer 120 and the bonding portion 150 and between the second conductive shielding layer 130 and the bonding portion 150 increase. Consequently, the magnetic flux generated in the second conductive shielding layer 130 can be transferred to the first conductive shielding layer 120 efficiently.

The length L2 of the bonding portion 150 in the second direction may be smaller than the thickness d1 of the first end surface 122 and a thickness d2 of the second end surface 132. Specifically, the length L2 of the bonding portion 150 in the second direction may be smaller than the thickness d1 of the first conductive shielding layer 120 or the thickness d3 of the second conductive shielding layer 130.

In some embodiments, the length L2 of the bonding portion 150 in the second direction may be smaller than a thickness of the semiconductor chip 140.

In some embodiments, the length L2 of the bonding portion 150 in the second direction may be larger than the thickness d1 of the first conductive shielding layer 120 and/or the thickness d3 of the second conductive shielding layer 130. In this instance, however, the amount of the magnetic flux generated in the second conductive shielding layer 130 may be reduced in the course of being transferred to the first conductive shielding layer 120.

The areas of the first and second contact surfaces 151 and 152 may be larger than the areas of the first and second end surfaces 122 and 132. Accordingly, the contact areas between the first conductive shielding layer 120 and the bonding portion 150 and between the second conductive shielding layer 130 and the bonding portion 150 increase, so that the magnetic flux generated in the second conductive shielding layer 130 can be transferred to the first conductive shielding layer 120 more efficiently.

A thickness d1 of the first end surface 122 may be substantially equal to a thickness d2 of the second end surface 132, for instance, where the thickness d1 of the first conductive shielding layer 120 is substantially equal to the thickness d3 of the second conductive shielding layer 130. However, the present disclosure is not limited thereto. In some embodiments, the thickness d1 of the first conductive shielding layer 120 may differ from the thickness d3 of the second conductive shielding layer 130.

Hereinafter, the effect of shielding external magnetic field achieved by separated conductive shielding layers will be described with reference to FIG. 3.

Figure 3:
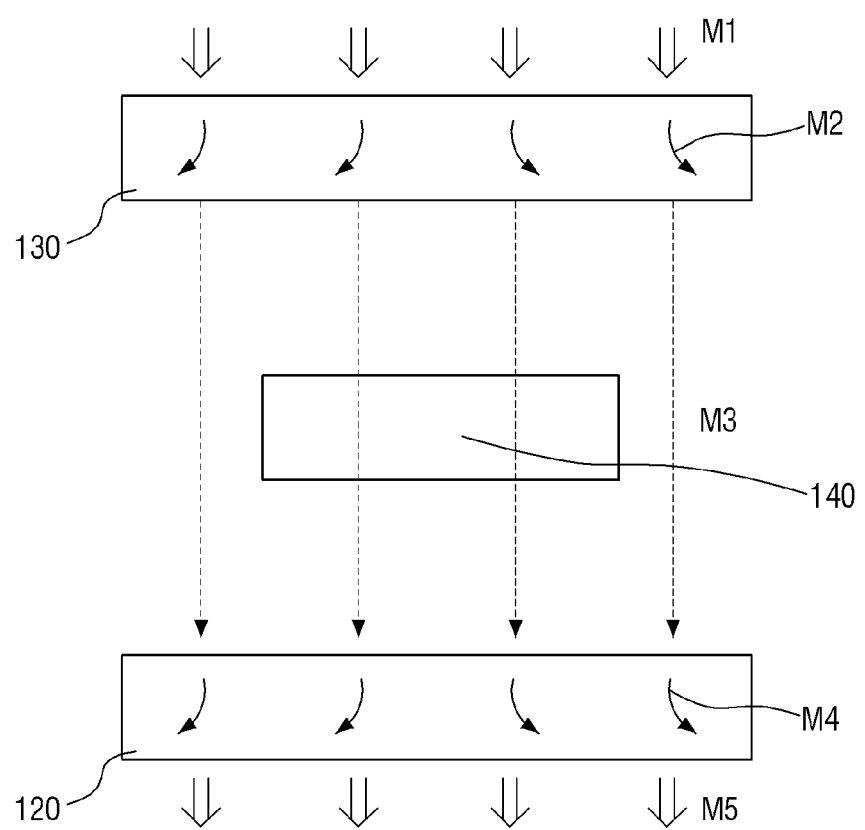
FIG. 3 is a view for illustrating the effect of shielding external magnetic field achieved by separated conductive shielding layers.

FIG. 3 is a view for illustrating the effect of shielding external magnetic field achieved by separated conductive shielding layers.

Referring to FIG. 3, a first conductive shielding layer 120 may be disposed below a semiconductor chip 140, and a second conductive shielding layer 130 may be disposed above the semiconductor chip 140. The first conductive shielding layer 120 and the second conductive shielding layer 130 may not be connected to each other.

The second conductive shielding layer 130 may be affected by a first external magnetic field M1 to generate a first magnetic flux M2 therein. Then, an internal magnetic flux M3 may be generated inside the semiconductor device due to the first magnetic flux M2. When this happens, the semiconductor chip 140 disposed in the semiconductor device may malfunction as it is affected by the magnetic field.

The first conductive shielding layer 120 may be affected by the internal magnetic field M3 to generate a second magnetic flux M4 therein. Then, a second external magnetic field M5 may be generated due to the second magnetic flux M4.

As can be seen from FIG. 3, with the first conductive shielding layer 120 and the second conductive shielding layer 130 separated from each other, the semiconductor chip 140 disposed in the semiconductor device may be affected by the external magnetic field.

Hereinafter, the amount of transferred magnetic flux in semiconductor devices according to some exemplary embodiments of the present disclosure will be described with reference to FIG. 4.

Figure 4:
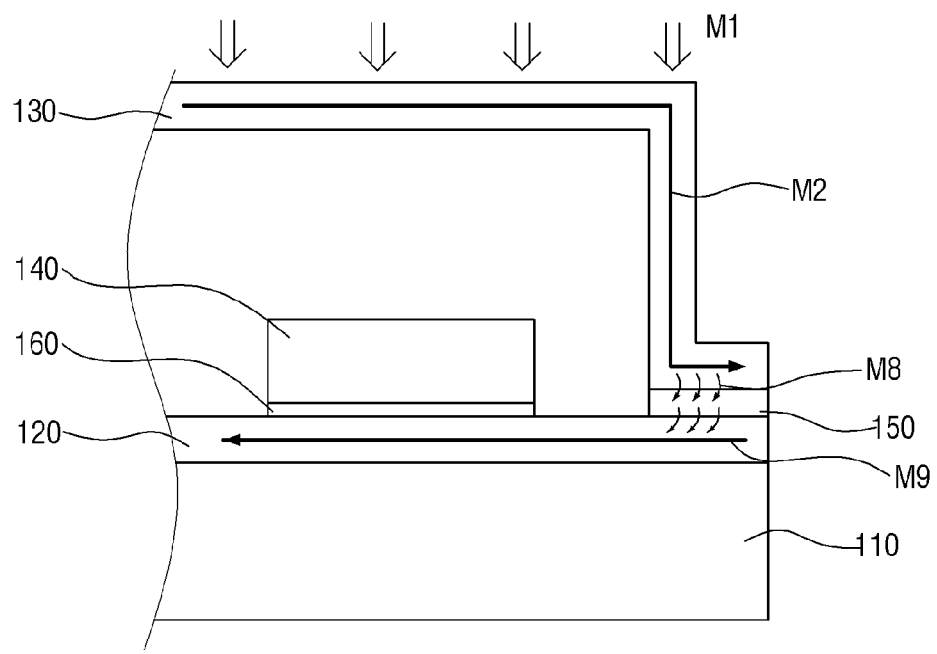
FIG. 4 is a diagram for illustrating the amount of transferred magnetic flux in semiconductor devices according to some exemplary embodiments of the present disclosure.

FIG. 4 is a diagram for illustrating the amount of transferred magnetic flux in semiconductor devices according to some exemplary embodiments of the present disclosure.

Referring to FIG. 4, a second conductive shielding layer 130 may be affected by an external magnetic field M1 to generate a first magnetic flux M2 therein. Then, the first magnetic flux M2 may be transferred to the bonding portion 150. The bonding portion 150 may be affected by the first magnetic flux M2 to generate a second magnetic flux M8 therein.

In this instance, the contact area between the second conductive shielding layer 130 and the bonding portion 150 is relatively large, and thus the magnitude of the magnetic flux transferred to the bonding portion 150 may increase. Then, the first conductive shielding layer 120 may be affected by the second external magnetic field M8 to generate a third magnetic flux M9 therein.

The magnitude of the second magnetic flux M8 generated in the bonding portion 150 may increase with an increase in the contact area between the second conductive shielding layer 130 and the bonding portion 150. In addition, the magnitude of the third magnetic flux M9 generated in the first conductive shielding layer 120 may increase with an increase in the contact area between the first conductive shielding layer 120 and the bonding portion 150.

Specifically, the larger the contact areas between the first conductive shielding layer 120 and the bonding portion 150 and between the second conductive shielding layer 130 and 150 are, the higher the effect of shielding the external magnetic flux M1 achieved by the semiconductor device 100.

As the contact areas between the first conductive shielding layer 120 and the bonding portion 150 and between the second conductive shielding layer 130 and 150 increase, the magnitudes of the second magnetic flux M8 and the third magnetic flux M9 may become substantially equal to the magnitude of the first magnetic flux M2.

Hereinafter, a semiconductor device according to another exemplary embodiment of the present disclosure will be described with reference to FIG. 5. Descriptions will be made focusing on the differences from the semiconductor device according to the first exemplary embodiment.

Figure 5:
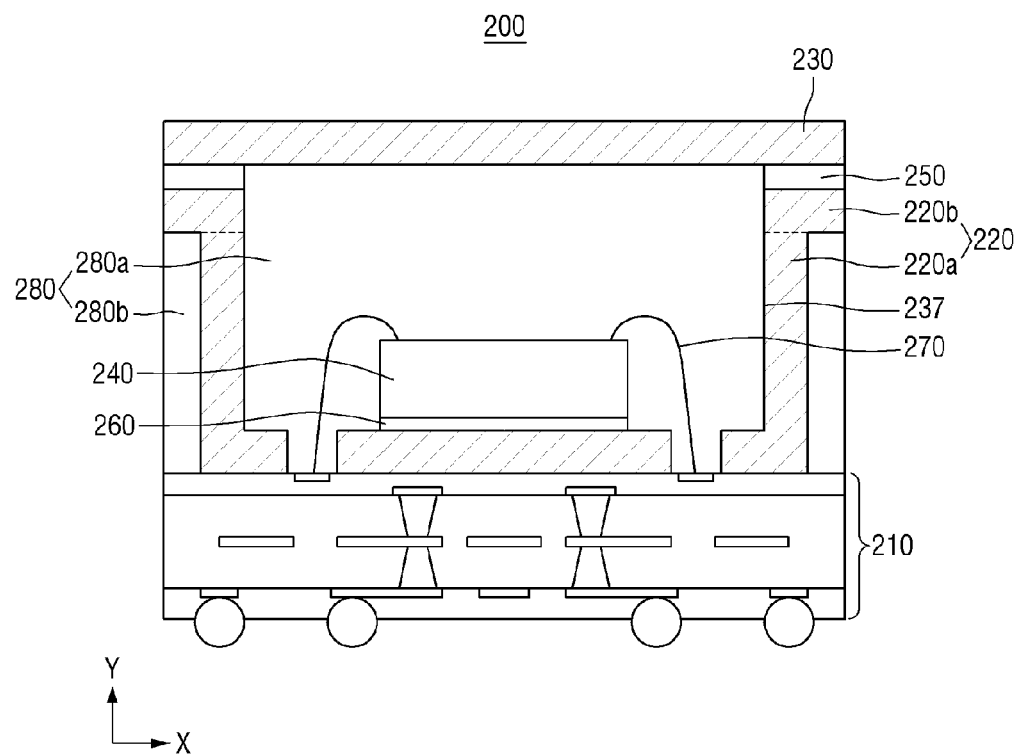
FIG. 5 is a cross-sectional view of a semiconductor device according to another exemplary embodiment of the present disclosure.

FIG. 5 is a cross-sectional view of a semiconductor device according to another exemplary embodiment of the present disclosure.

Referring to FIG. 5, a semiconductor device 200 may include a substrate 210, a first conductive shielding layer 220, a second conductive shielding layer 230, a semiconductor chip 240, a bonding portion 250, an adhesion layer 260, a bonding wire 270 and a molding member 280.

The second conductive shielding layer 230 may be disposed on the bonding portion 250 and the molding member 280. Specifically, the second conductive shielding layer 230 may cover the bonding portion 250 disposed on the first conductive shielding layer 220 and the molding member 280. More specifically, a side portion 220a (or a vertical portion) of the first conductive shielding layer 220 may extend along the side surface 237 of the molding member 280. An inner portion 280a of the molding member 280 may therefore be substantially surrounded by the first and second conductive shielding layers 220, 230 while an outer portion 280b of the molding member 280 may be formed outside the first conductive shielding layer 220a. The extension portion 220b of the first conductive shielding layer 220 may contact the bottom surface of the bonding portion 250.

Unlike the semiconductor device 100 according to the first exemplary embodiment, in the semiconductor device 200 according to this exemplary embodiment, the first conductive shielding layer 220 may be disposed on the side surface 237 of the molding member 280, and the second conductive shielding layer 230 may not extend along the side surface 237 of the molding member 280. The bonding portion 250 may be arranged on the side surface of an upper portion of the molding member 280.

The semiconductor device 200 may form a sealed space defined by the first conductive shielding layer 220, the second conductive shielding layer 230 and the bonding portion 250. Specifically, the semiconductor chip 240 may be sealed by the top surface and the sidewalls of the first conductive shielding layer 220, a side surface of the bonding portion 250 and the bottom surface of the second conductive shielding layer 230. Accordingly, the semiconductor chip 240 may be shielded from external magnetic field.

Hereinafter, a semiconductor device according to another exemplary embodiment of the present disclosure will be described with reference to FIG. 6. Descriptions will be made focusing on the differences from the semiconductor device according to the first exemplary embodiment.

Figure 6:
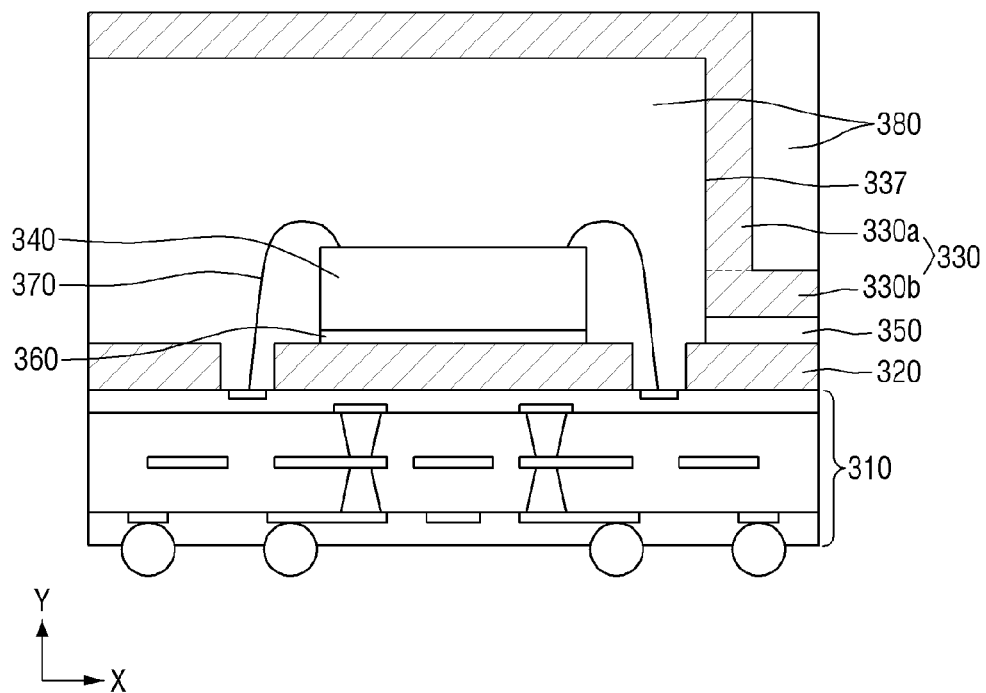
FIG. 6 is a cross-sectional view of a semiconductor device according to another exemplary embodiment of the present disclosure.

FIG. 6 is a cross-sectional view of a semiconductor device according to another exemplary embodiment of the present disclosure.

Referring to FIG. 6, a semiconductor device 300 may include a substrate 310, a first conductive shielding layer 320, a second conductive shielding layer 330, a semiconductor chip 340, a bonding portion 350, an adhesion layer 360, a bonding wire 370 and a molding member 380.

The second conductive shielding layer 330 may be disposed on the bonding portion 350 and the molding member 380. Specifically, the second conductive shielding layer 330 may cover the bonding portion 350 disposed on the first conductive shielding layer 320 and the molding member 380. More specifically, a side portion 330a (or a vertical portion) of the second conductive shielding layer 330 may extend along a side surface 337 of the molding member 380. An extension portion 330b of the second conductive shielding layer 330 may contact the top surface of the bonding portion 350.

Unlike the semiconductor device 100 according to the first exemplary embodiment, in the semiconductor device 300 according to this exemplary embodiment, the second conductive shielding layer 330 may be disposed on only one side of the molding member 380, and the first conductive shielding layer 320 may not extend along the side surface 337 of the molding member 380. The bonding portion 350 may cover a portion of the side surface 337 along the lower portion of the molding member 380.

The first conductive shielding layer 320, the second conductive shielding layer 330 and the bonding portion 350 may be in a substantially U-shape to partially surround the semiconductor chip 340. Accordingly, the semiconductor chip 340 may be shielded from external magnetic field.

Hereinafter, a semiconductor device according to another exemplary embodiment of the present disclosure will be described with reference to FIG. 7. Descriptions will be made focusing on the differences from the semiconductor device according to the first exemplary embodiment.

Figure 7:
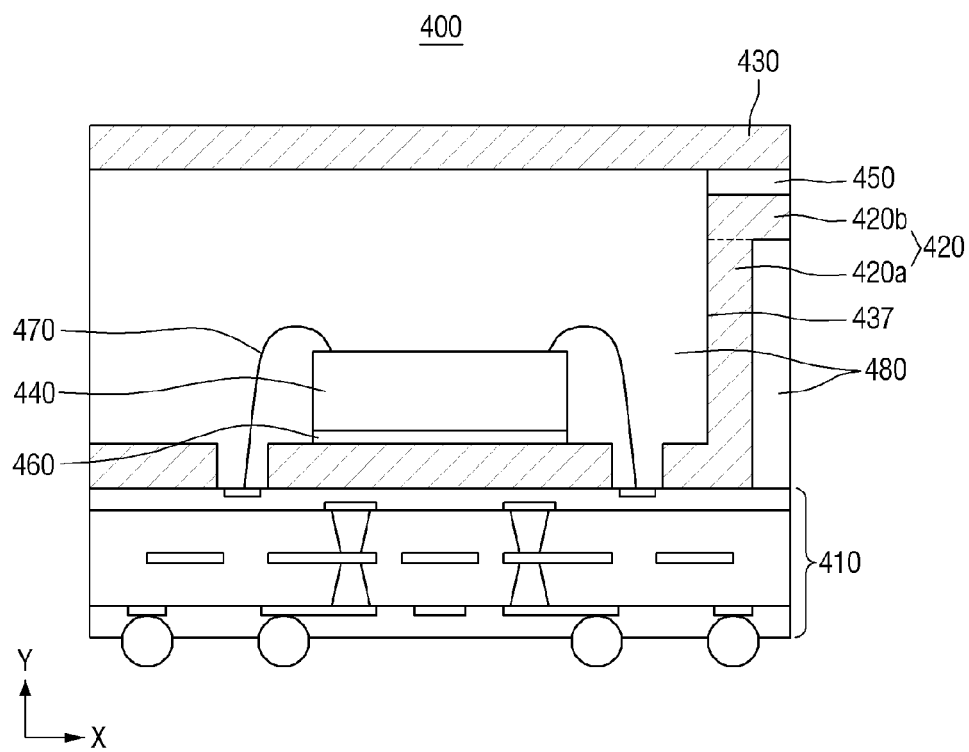
FIG. 7 is a cross-sectional view of a semiconductor device according to another exemplary embodiment of the present disclosure.

FIG. 7 is a cross-sectional view of a semiconductor device according to another exemplary embodiment of the present disclosure.

Referring to FIG. 7, a semiconductor device 400 may include a substrate 410, a first conductive shielding layer 420, a second conductive shielding layer 430, a semiconductor chip 440, a bonding portion 450, an adhesion layer 460, a bonding wire 470 and a molding member 480.

The second conductive shielding layer 430 may be disposed on the bonding portion 450 and the molding member 480. Specifically, the second conductive shielding layer 430 may cover the bonding portion 450 disposed on the first conductive shielding layer 420 and the molding member 480. More specifically, a side portion 420a (or a vertical portion) of the first conductive shielding layer 420 may extend along a side surface 437 of the molding member 480. An extension portion 420b may be arranged at a top of the side portion 420a to contact the bonding portion 450. A bonding surface of the extension portion 420b may therefore contact a bottom surface of the bonding portion 450.

Unlike the semiconductor device 100 according to the first exemplary embodiment, in the semiconductor device 400 according to this exemplary embodiment, the first conductive shielding layer 420 may include the side portion 420a that extends upwardly and may be disposed on only one side of the molding member 480. Furthermore, the second conductive shielding layer 430 may not include side portions that extend along the side surfaces of the molding member 480. The bonding portion 450 may be arranged on only one side surface of an upper portion of the molding member 480.

The first conductive shielding layer 420, the second conductive shielding layer 430 and the bonding portion 450 may be in a U-shape to surround the semiconductor chip 440. Accordingly, the semiconductor chip 440 may be shielded from external magnetic field.

Hereinafter, a semiconductor device according to another exemplary embodiment of the present disclosure will be described with reference to FIG. 8. Descriptions will be made focusing on the differences from the semiconductor device according to the first exemplary embodiment.

Figure 8:
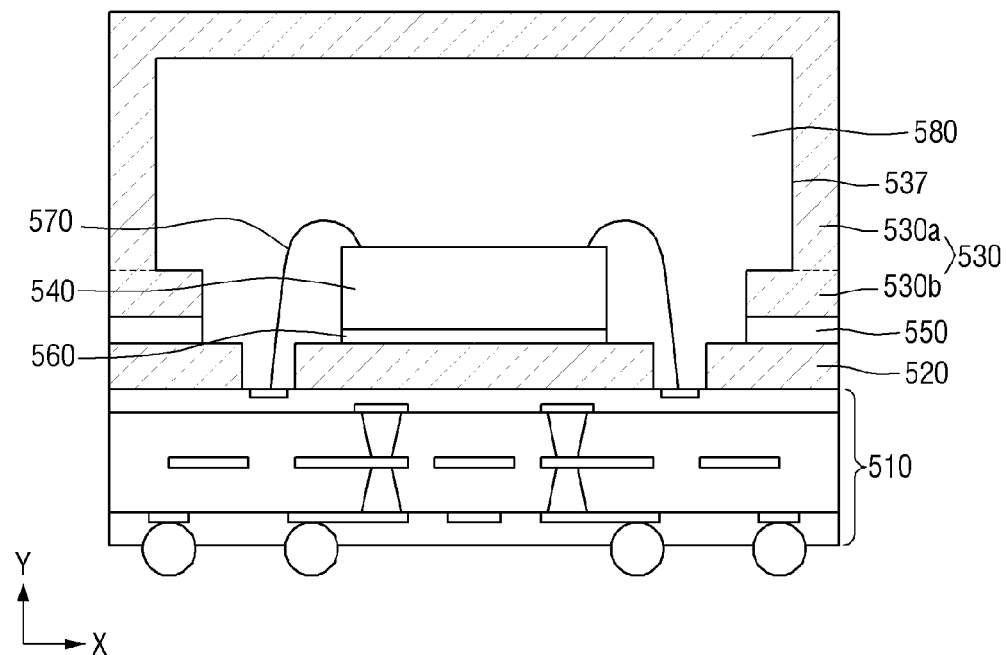
FIG. 8 is a cross-sectional view of a semiconductor device according to another exemplary embodiment of the present disclosure.

FIG. 8 is a cross-sectional view of a semiconductor device according to another exemplary embodiment of the present disclosure.

Referring to FIG. 8, a semiconductor device 500 may include a substrate 510, a first conductive shielding layer 520, a second conductive shielding layer 530, a semiconductor chip 540, a bonding portion 550, an adhesion layer 560, a bonding wire 570 and a molding member 580. The second conductive shielding layer 530a may include a side portion 530a and an extension portion 530b. The side portion 530a extends along a side surface 537 of the molding member 580.

An end surface of the second conductive shielding layer 530 and the bonding portion 550 may protrude into a sealed space. No molding member may be disposed on side surfaces of the second conductive shielding layer 530.

Unlike the semiconductor device 100 according to the first exemplary embodiment, in the semiconductor device 500 according to this exemplary embodiment, the extension portion 530b of the second conductive shielding layer 530 extends inwardly toward an interior of the sealed space. Accordingly, an outside end surface of the first conductive shielding layer 520, an outside end surface of the second conductive shielding layer 530, and the bonding portion 550 may not protrude from the sealed space. Accordingly, the semiconductor device 500 may be smaller than the semiconductor device 100.

The semiconductor device 500 may form a sealed space defined by the first conductive shielding layer 520, the second conductive shielding layer 530 and the bonding portion 550. Specifically, the semiconductor chip 540 may be sealed by the top surface of the first conductive shielding layer 520, the sidewalls of the second conductive shielding layer 530, one side surface of the bonding portion 550 and the bottom surface of the second conductive shielding layer 530. Accordingly, the semiconductor chip 540 may be shielded from an external magnetic field.

Hereinafter, a semiconductor device according to another exemplary embodiment of the present disclosure will be described with reference to FIG. 9. Descriptions will be made focusing on the differences from the semiconductor device according to the first exemplary embodiment.

Figure 9:
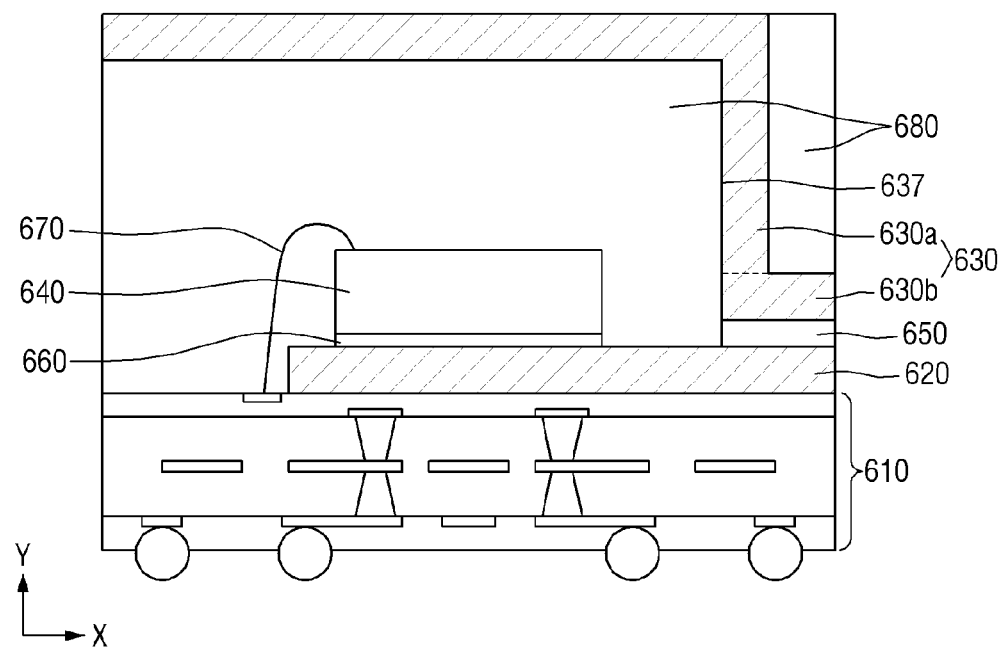
FIG. 9 is a cross-sectional view of a semiconductor device according to another exemplary embodiment of the present disclosure.

FIG. 9 is a cross-sectional view of a semiconductor device according to another exemplary embodiment of the present disclosure.

Referring to FIG. 9, a semiconductor device 600 may include a substrate 610, a first conductive shielding layer 620, a second conductive shielding layer 630, a semiconductor chip 640, a bonding portion 650, an adhesion layer 660, a bonding wire 670 and a molding member 680.

The second conductive shielding layer 630 may be disposed on the bonding portion 650 and the molding member 680. Specifically, the second conductive shielding layer 630 may cover the bonding portion 650 disposed on the first conductive shielding layer 620 and the molding member 680. More specifically, a side portion 630a (or a vertical portion) of the second conductive shielding layer 630 may extend along a side surface 637 of the molding member 680. An extension portion 630b of the second conductive shielding layer 630 may contact the top surface of the bonding portion 650.

Unlike the semiconductor device 100 according to the first exemplary embodiment, in the semiconductor device 600 according to this exemplary embodiment, the first conductive shielding layer 630 may be disposed on only one side of the molding member 680, and the first conductive shielding layer 620 may not extend to the side surface 637 of the molding member 680 opposite the side portion 630a of the second conductive shielding layer 630. The bonding portion 650 may be arranged on only one side surface along a lower portion of the molding member 680.

The first conductive shielding layer 620, the second conductive shielding layer 630 and the bonding portion 650 may therefore form a substantially U-shape that partially surrounds the semiconductor chip 640. Accordingly, the semiconductor chip 640 may be shielded from external magnetic field.

Unlike the semiconductor device 100, in the semiconductor device 600, no opening may be formed in the first conductive shielding layer 620. Specifically, the first conductive shielding layer 620 may not be disposed on some portions of the substrate 610.

The semiconductor chip 640 may be electrically connected to the substrate 610 by using a bonding wire 670 in the area where the first conductive shielding layer 620 is not disposed.

Hereinafter, a method for fabricating a semiconductor device according to an exemplary embodiment of the present disclosure will be described with reference to FIGS. 10 to 14.

FIGS. 10 to 14 are views for illustrating processes of a method for fabricating a semiconductor device according to an exemplary embodiment of the present disclosure.

Figure 10:
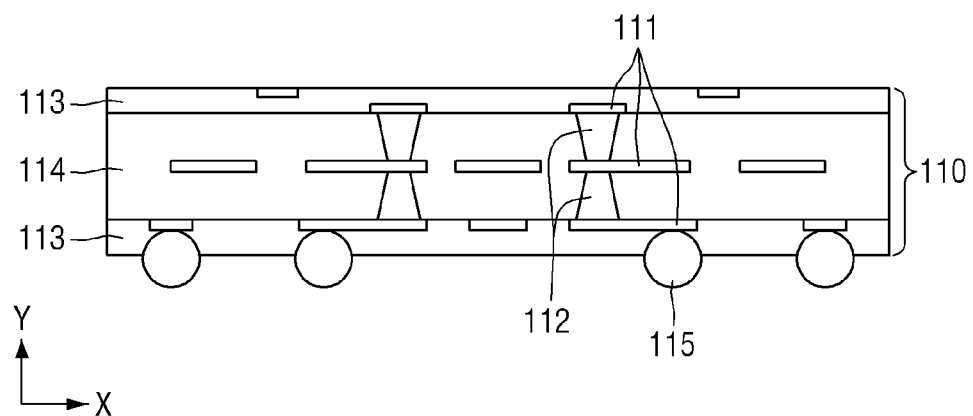
FIGS. 10 to 14 are views for illustrating processes of a method for fabricating a semiconductor device according to an exemplary embodiment of the present disclosure.

Referring to FIG. 10, a substrate 110 may be formed. The substrate 110 may be a printed circuit board (PCB) that includes wiring layers (or line layers) 111, through vias 112, solder mask layers 113, insulation layers 114 and external connection terminals 115.

Figure 11:
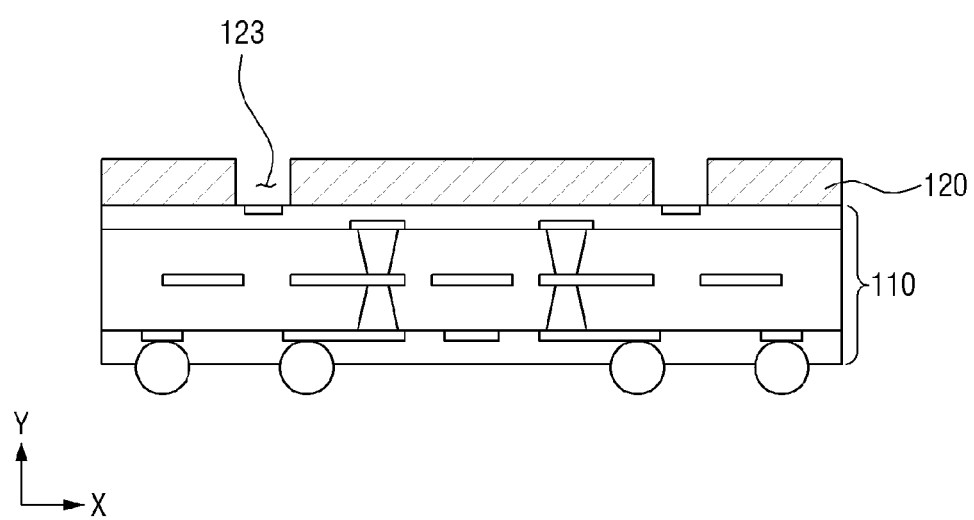

Referring to FIG. 11, a first conductive shielding layer 120 may be formed on the substrate 110. Specifically, the first conductive shielding layer 120 formed of a conductive material may be conformally formed on the substrate 110. Subsequently, some portions of the first conductive shielding layer 120 may be etched to form openings 123 that penetrate the first conductive shielding layer 120.

Figure 12:
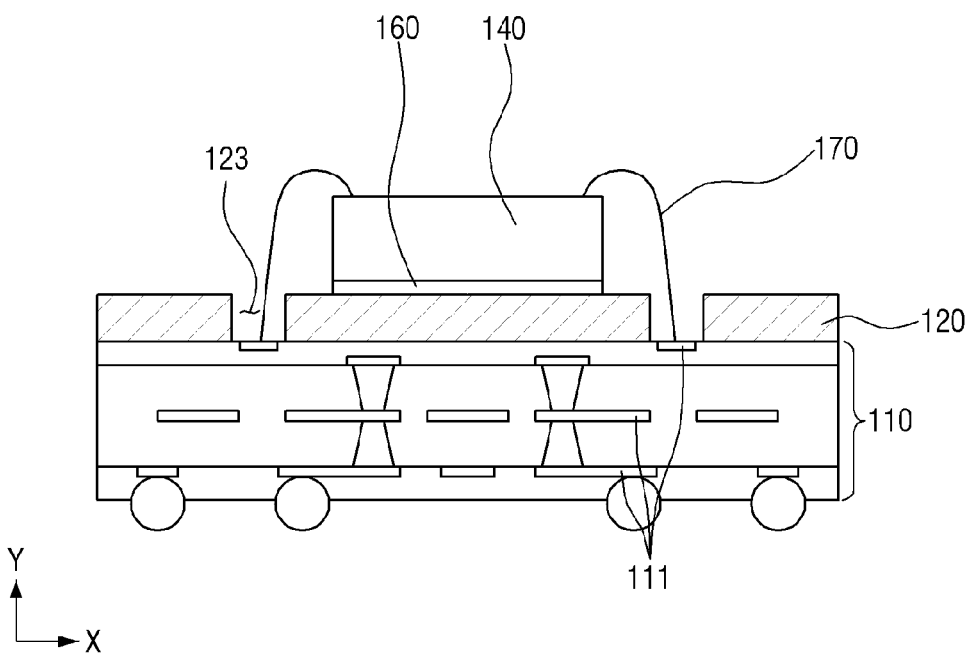

Referring to FIG. 12, an adhesion layer 160 may be formed on a portion (e.g., the center portion) of the first conductive shielding layer 120. For example, the adhesion layer 160 may not be formed on the positions where openings 123 are formed. Subsequently, a semiconductor chip 140 may be formed on the adhesion layer 160. The semiconductor chip 140 may be bonded to the substrate 110 using the adhesion layer 160.

After the semiconductor chip 140 is formed, the semiconductor chip 140 may be connected to the substrate 110 by using a bonding wire 170. Specifically, the bonding wire 170 may electrically connect the semiconductor chip 140 to the wiring layers 111 in the substrate 110 via the openings 123.

Figure 13:
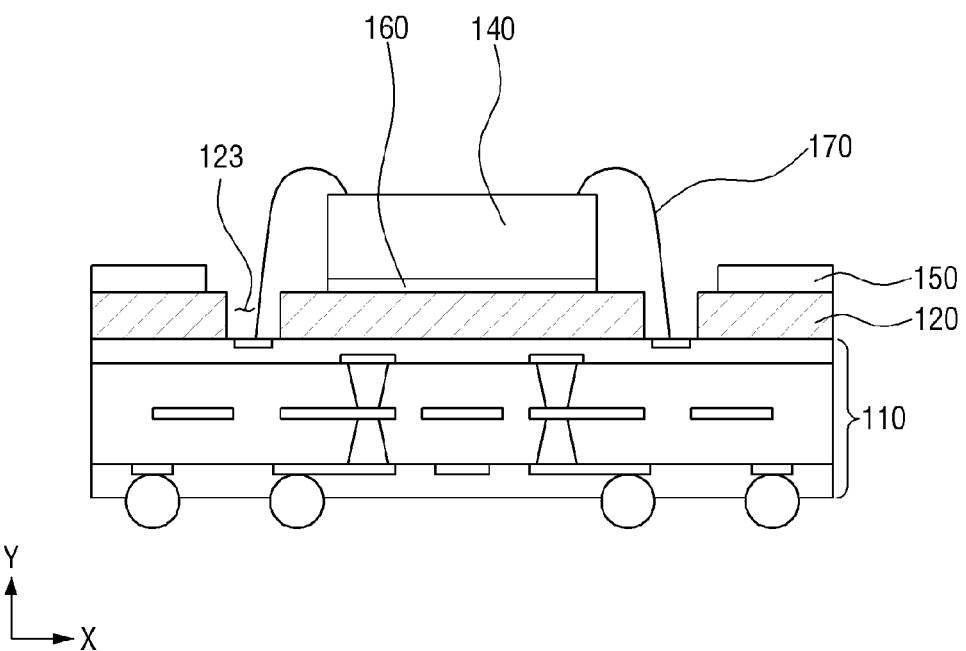

Referring to FIG. 13, a bonding portion 150 may be substantially parallel with the first conductive shielding layer 120 such that it is disposed along the periphery of the first conductive shielding layer 120 to surround the semiconductor chip 140 in plan view (not illustrated). The bonding portion 150 may be formed on a portion of the first conductive shielding layer 120. For example, the bonding portion 150 may not be formed on portions of the first conductive shielding layer 120 where the openings 123 are formed.

Figure 14:
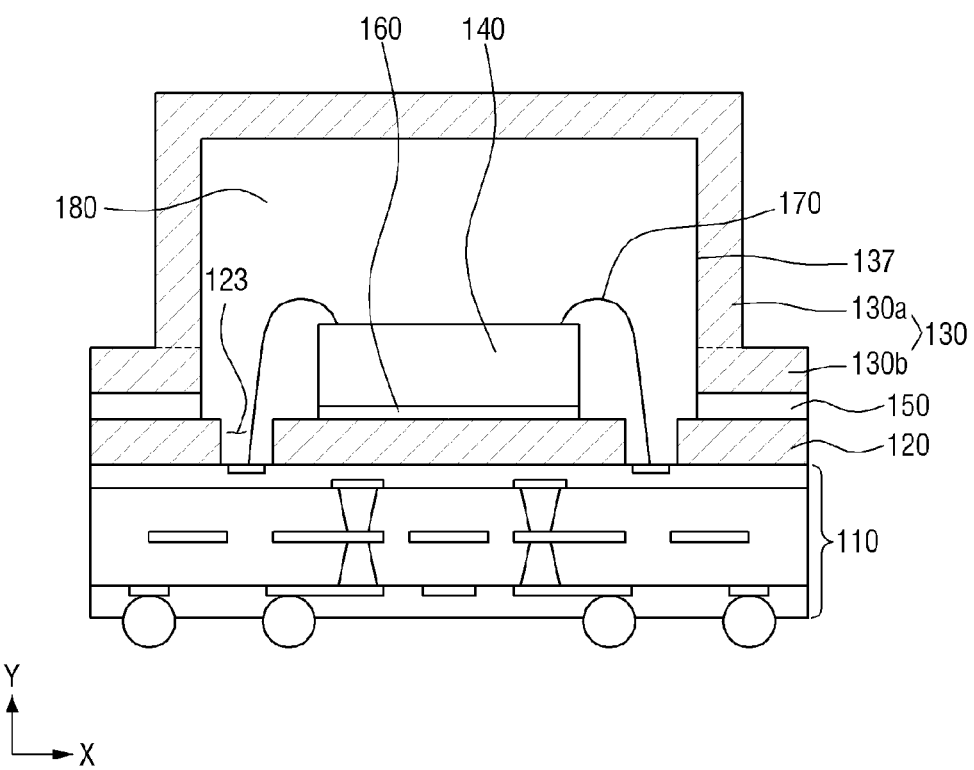

Referring to FIG. 14, the molding member 180 may be formed over the substrate 110 to cover the semiconductor chip 140. Specifically, the molding member 180 may cover the semiconductor chip 140, a portion of the substrate 110 exposed through the openings 123, and a portion of the first conductive shielding layer 120.

Subsequently, a second conductive shielding layer 130 may be formed on the bonding portion 150 and on the molding member 180. Specifically, the second conductive shielding layer 130 may cover the bonding portion 150 disposed on the first conductive shielding layer 120 and the molding member 180. More specifically, a side portion 130a of the second conductive shielding layer 130 may extend along a side surface 137 of the molding member 180. An extension portion 130b of the second conductive shielding layer 130 may be arranged at a bottom of the side portion 130a to cover the bonding portion 150.

After the second conductive shielding layer 130 is formed, the molding member 180 may be disposed to cover the side surfaces of the second conductive shielding layer 130. Through the above-described processes, the semiconductor device 100 of FIG. 1 can be fabricated.

Figure 15:
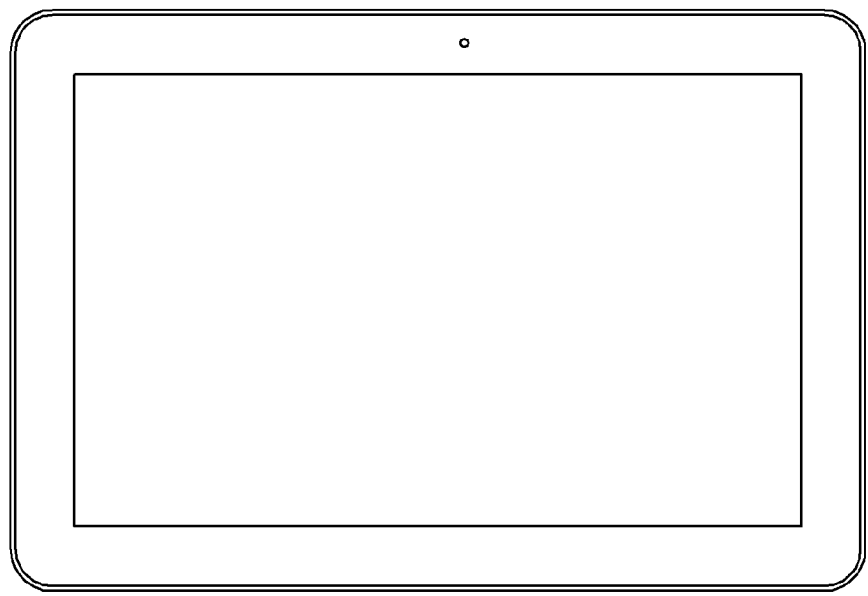
FIG. 15 shows an example of a semiconductor system that can employ semiconductor devices according to some exemplary embodiments of the present disclosure.

FIG. 15 shows an example of a semiconductor system that can employ the semiconductor devices according to some exemplary embodiments of the present disclosure. FIG. 15 shows a tablet personal computer (PC). At least one of the semiconductor devices according to some exemplary embodiment of the present disclosure may be used in the tablet PC. As will be appreciated by those skilled in the art, the semiconductor devices according to some exemplary embodiments of the present disclosure may be employed by other integrated circuit devices.

Figure 16:
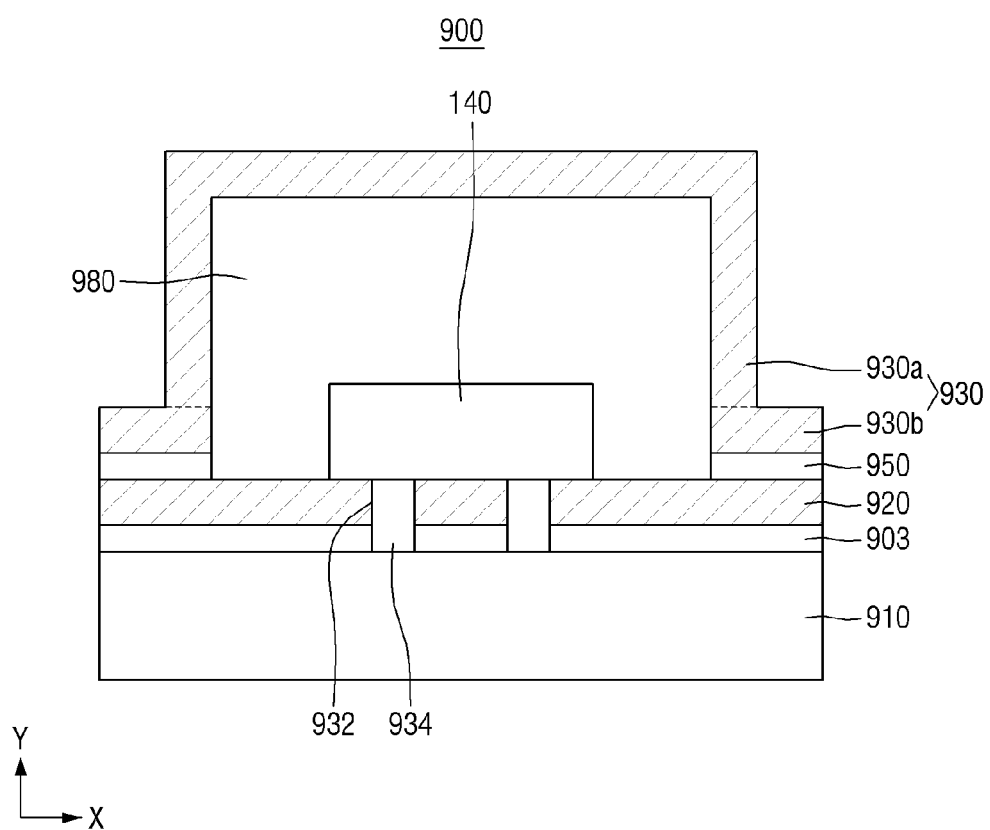
FIG. 16 is a cross-sectional view of a semiconductor device according to some embodiments.

As shown in FIG. 16, a first conductive shielding layer 920 may include a plurality of penetration holes 932, through which a substrate 910 such as a printed circuit board (PCB) 910 may be exposed. In contrast with the previous embodiments where the semiconductor chip 140 is coupled to the substrate 110 through the bonding wire 170, the semiconductor chip 140 may be electrically connected to the substrate 910 through a through electrode 934 formed in a plurality of penetration holes 932. As in the previous embodiments, a second conductive shielding layer 930 is formed on the first conductive shielding layer 920 and on the semiconductor chip 140. A side portion 930a of the second conductive shielding layer 930 may extend along a side surface of a molding member 980. The molding member 980 encapsulates the semiconductor chip 140. Also, a bonding portion 950 may extend between an extension portion 930b of the second conductive shielding layer 930 and the first conductive shielding layer 920 similar to the embodiment of FIG. 1. A PCB adhesion layer 903 may be formed between the first conductive shielding layer 920 and the substrate 910.

Figure 17:
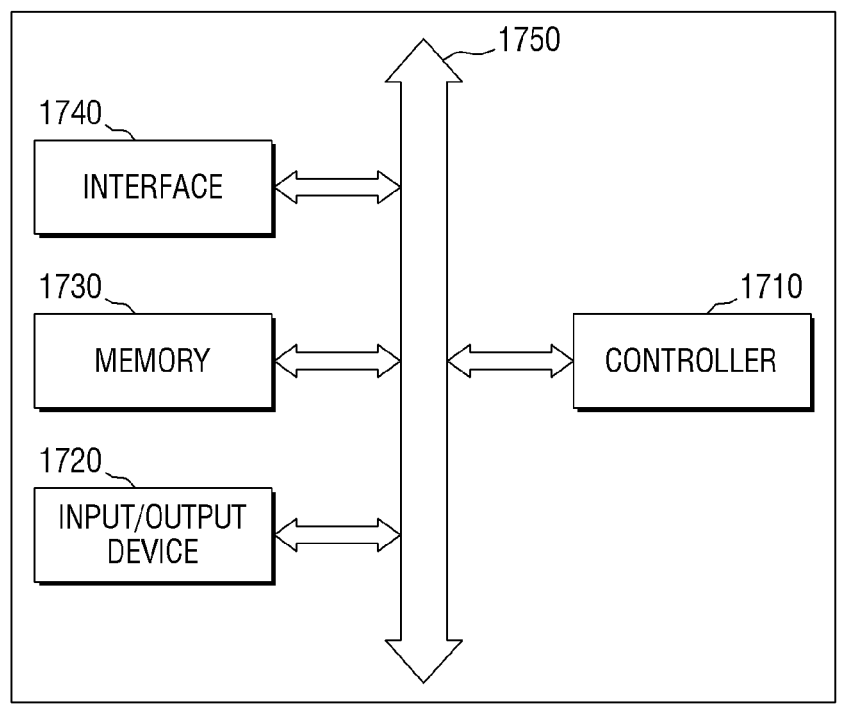
FIG. 17 is a diagram illustrating an electronic system including a semiconductor package according to some embodiments.

FIG. 17 is a diagram illustrating an electronic system including a semiconductor package according to some embodiments.

The electronic system 1700 may include a controller 1710, an input/output device 1720, a memory 1730, and an interface 1740. The electronic system 1700 may be, for example, a mobile system or a system that transmits or receives information. Examples of the mobile system may include a personal digital assistant (PDA), a portable computer, a web tablet, a wireless phone, a mobile phone, a digital music player, and a memory card.

The controller 1710 may execute a program and control the electronic system 1700. The controller 1710 may include a semiconductor chip manufactured by a wafer testing apparatus according to an embodiment. Examples of the controller 1710 may include a microprocessor, a digital signal processor and a microcontroller and its similar device.

The input/output device 1720 may be configured to be used to input and output data of the electronic system 1700. The electronic system 1700 may be connected to an external device, for example, a personal computer or a network, by using the input/output device 1720 and may exchange data with the external device. Examples of the input/output device 1720 may include a keypad, a keyboard, and a display.

The memory 1730 may be configured to store codes and/or data for operations of the controller 1710 and/or may store data processed by the controller 1710. The memory 1730 may include a semiconductor chip manufactured by a wafer testing apparatus according to an embodiment. The interface 1740 may be a data transmission path between the electronic system 1700 and another external device. The controller 1710, the input/output device 1720, the memory 1730, and the interface 1740 may communicate with one another through a bus 1750.

For example, the electronic system 1700 may be used for a mobile phone, an MP3 player, a navigation device, a PMP, an SSD, or household appliances.

Although the exemplary embodiments of the present disclosure have been described with reference to the accompanying drawings, those skilled in the art will readily appreciated that various modifications and alterations may be made without departing from the technical idea or features of the present disclosure. Therefore, it should be understood that the above-mentioned embodiments are not limiting but illustrative in all aspects.

What is claimed is:

1. A semiconductor device comprising:
a substrate comprising a wiring layer;
a first conductive shielding layer disposed on the substrate and electrically insulated from the wiring layer, the first conductive shielding layer comprising a first bonding surface and a first end surface extending from the first bonding surface;
a semiconductor chip disposed on the first conductive shielding layer;
a molding member disposed over the first conductive shielding layer to cover the semiconductor chip;
a second conductive shielding layer disposed over the first conductive shielding layer and the molding member, the second conductive shielding layer comprising a second bonding surface and a second end surface extending from the second bonding surface; and
a bonding portion disposed between the first and second bonding surfaces, the bonding portion comprising a top surface and a bottom surface opposite to the top surface,
wherein the bottom surface of the bonding portion contacts the first bonding surface to form a first contact surface,
wherein the top surface of the bonding portion contacts the second bonding surface to form a second contact surface, and
wherein an area of the second contact surface is larger than an area of the second end surface.

2. The semiconductor device of claim 1, wherein the first contact surface faces the second contact surface.

3. The semiconductor device of claim 2, wherein an area of the first contact surface is equal to the area of the second contact surface.

4. The semiconductor device of claim 3, wherein an area of the first bonding surface is equal to the area of the first contact surface.

5. The semiconductor device of claim 1, wherein an area of the first contact surface is larger than an area of the first end surface.

6. The semiconductor device of claim 1, wherein the first conductive shielding layer comprises a side portion extending along a side surface of the molding member.

7. The semiconductor device of claim 1, wherein the first conductive shielding layer, the second conductive shielding layer and the bonding portion formed a sealed space above the substrate.

8. The semiconductor device of claim 1, wherein the second conductive shielding layer extends along a side surface of the molding member.

9. The semiconductor device of claim 1, wherein the bonding portion contains at least one organic resin chosen from an epoxy resin, an acrylic resin, a polyester resin and a polycarbonate.

10. The semiconductor device of claim 9, wherein the bonding portion comprises a filler containing nickel (Ni).

* * * * *